United States Patent [19]
Harzer et al.

[11] 3,875,524
[45] Apr. 1, 1975

[54] PHASE-STABLE DECADICALLY ADJUSTABLE FREQUENCY SYNTHESIZER

[75] Inventors: Peter Harzer; Günther Hoffman, both of Eningen, Germany

[73] Assignee: Wandel u. Goltermann, Reutlingen, Germany

[22] Filed: Aug. 16, 1973

[21] Appl. No.: 388,887

[30] Foreign Application Priority Data

Aug. 16, 1972 Germany .......... 2240216

[52] U.S. Cl. .......... 331/1 A, 331/25
[51] Int. Cl. .......... H03b 3/04
[58] Field of Search .......... 331/1 A, 18, 25

[56] References Cited

UNITED STATES PATENTS 3,516,007 6/1970 Bos et al. .......... 331/18

*Primary Examiner*—Siegfried H. Grimm
*Attorney, Agent, or Firm*—Karl F. Ross; Herbert Dubno

[57] ABSTRACT

A variable-frequency oscillator, generating a succession of spikes of adjustable repetition frequency F, works through a pulse subtractor and a frequency divider with several cascaded decadic stages and a terminal binary stage into a phase comparator also receiving the output of a generator of reference frequency *f*. The pulse subtractor comprises two units separated by the first decadic divider stage, each unit supressing an incoming spike in response to a pulse applied to a control input thereof. The last decadic divider stage has a set of output leads connected in parallel to several digital selectors, one of them serving to transmit control pulses to the first subtractor unit whereas the others generate a train of control pulses for the second subtractor unit through a chain of decadic step-down stages individually loaded by the lowest-ranking selectors whose pulse rates are subharmonically related to reference frequency *f*. Several coincidence circuits, connected in parallel with the selectors to the output leads of the last decadic divider stage, are also connected to output leads of respective step-down stages in the chain in order to generate timing signals measuring the fraction of a reference-frequency cycle required to make the count of that divider stage equal to that of the associated step-down stage; during the interval so measured, a compensating current flows into the phase comparator to control the slope of a sawtooth wave generated therein, thereby preventing the subharmonically recurring control pulses from causing fluctuations in the selected oscillator frequency F. The binary divider stage limits the generation of control pulses to odd-numbered halves and the flow of compensating current to even-numbered halves of its operating cycle.

9 Claims, 7 Drawing Figures

PHASE-STABLE DECADICALLY ADJUSTABLE FREQUENCY SYNTHESIZER

FIELD OF THE INVENTION

Our present invention relates to an adjustable frequency synthesizer in which a variable-frequency oscillator is controlled, through the intermediary of a phase comparator, by a generator of constant reference frequency whose output is continuously matched with that of a frequency divider driven by the oscillator.

BACKGROUND OF THE INVENTION

In commonly owned application Ser. No. 388,886, filed concurrently by one of us, Günther Hoffmann, now U.S. Pat. No. 3,840,822, there has been disclosed a frequency synthesizer of this nature wherein a pulse-rate modifier is inserted between the output of the variable-frequency divider, this modifier receiving on a control input a pulse train of repetition frequency or cadence $k$. The output of the oscillator is delivered to the modifier in the form of a succession of sharp spikes whose number per measuring period, i.e., per cycle of reference frequency $f$, is diminished by one for every control pulse arriving during such period. Thus, the frequency divider receives the spikes of the oscillator, operating at a frequency $F$, with a mean repetition frequency $F' = F - k$ which corresponds to a mean output frequency $F'/n$ fed to the phase comparator; during steady-state operation, in which this mean output frequency $F'/n$ is to equal the reference frequency $f$ also applied to the phase comparator, the relationship between frequencies $F$ and $f$ is therefore given by $F - nf + k$, with the parameter $k$ freely selectable and with $n$ representing the fixed step-down ratio of the divider.

If the number of control pulses per measuring period is invariant for a selected oscillator setting, which will be the case whenever the recurrence rate of individual pulses or pulse groups in the control train is equal to or a multiple of reference frequency $f$, the output of the phase comparator will be constant. With irregular or subharmonic control pulses, however, a phase jump will occur from time to time so that the oscillator frequency F would be subject to fluctuation if the frequency-determining element (e.g. a varactor) of the oscillator were directly energized by the comparator output. This discontinuity in the output voltage of the comparator can be mitigated, as disclosed in the concurrently filed application, by the insertion of a low-pass filter between the comparator and the frequency-control circuit of the oscillator; such a filter, however, must have a relatively large time constant which delays the attainment of steady-state operation upon any readjustment of the oscillator frequency.

Further smoothing of the output signal of the phase comparator can be achieved, as also disclosed in the concurrently filed application, through the provision of a digital/analog converter which receives the count of a decadic step-down stage controlled by a digital frequency selector, specifically a low-ranking selector operating in a range of frequency adjustment below reference frequency $f$: the converter then translates this count into a compensating electrical quantity (voltage or current) which is fed to the phase comparator to counteract the effect of a sudden phase shift due to subharmonically recurrent control pulses. Since the relative significance of these control pulses diminishes with increasing oscillator frequency, the converter also receives a corrective electrical quantity from an inverting frequency discriminator connected to the oscillator output, the magnitude of this corrective quantity being proportional to a cycle length $1/F$.

OBJECTS OF THE INVENTION

The general object of our present invention is to provide an even more versatile frequency synthesizer adapted to be adjusted in very small frequency increments $\Delta F$, e.g. of 1 Hz with oscillator frequencies on the order of 100 MHz.

A more particular object is to provide improved means for the compensation of phase shifts due to subharmonic control pulses without the need for a low-pass filter or the like, thereby facilitating rapid coarse as well as fine tuning.

A related object is to provide a frequency synthesizer which, by virtue of its substantial phase stability upon a readjustment of its operating frequency, can be used for periodic frequency modulations or "wobbling" in a circuit for testing the transmission characteristics of an impedance network.

SUMMARY OF THE INVENTION

These objects are realized, in accordance with our present invention, by the insertion of a pulse subtractor between the output of the variable-frequency oscillator and a decadic stage of the associated frequency divider, this subtractor suppressing an incoming spike in response to a control pulse applied thereto. A series of such control pulses are derived, with the aid of one or more digital selectors, from the decadic divider stage to produce a mean frequency lower than $F/n$ in the output of a terminal divider stage. The latter stage, advantageously constituted by a binary element such as a single flip-flop, controls a blocking circuit which limits the emission of control pulses to one part of a reference cycle and reserves another part of such cycle for the operation of compensating circuitry delivering to the phase comparator a corrective electrical quantity to balance the effect of control pulses with a recurrence rate smaller than $f$ upon the constancy of the oscillator frequency F.

Whereas in the concurrently filed Hoffmann application the compensating circuitry comprises a conventional digital/analog converter, we particularly contemplate for use in our present system a coincidence circuit connected to output leads of the aforementioned decadic divider stage and of a decadic step-down stage in the output of at least the lowest-ranking digital selector. The coincidence circuit emits a timing signal which measures the length of an interval between a predetermined point in a reference cycle (e.g., the beginning of such a cycle as initiated by a pulse from the reference-frequency generator) and the instant of detection of a match between the counts of the decadic divider stage and the associated step-down stage. A switch controlled by the coincidence circuit causes the emission of a corrective electrical quantity for the duration of the interval so measured.

By the provision of an individual coincidence circuit for each selector which produces control pulses at a rate subharmonically related to frequency $f$, each of these coincidence circuits causing the generation of a respective corrective voltage or current of a magnitude consistent with the decadic rank of the corresponding selector, we can practically eliminate the frequency fluctuations which would otherwise result from the suppression of oscillator spikes at nonuniform rates in successive measuring periods. Thus, if the corrective quantity is a constant charging current from an ancillary source for the capacitor of a sawtooth-wave generator included in the phase comparator, the resulting additional condenser charge is proportional to the length of the measured interval; as the count of the selector-controlled step-down stage progressively increases during successive measuring periods, the additional condenser charge also rises until the step-down stage is finally cleared after a certain number of such periods depending on the selected digit. The additional charge, then, builds up a stepped wave on the storage capacitor to which the charge of the capacitor of the sawtooth generator is periodically transferred (if desired, the supplemental current could also be transmitted directly to the storage capacitor). This stepped wave, integrated over a multiplicity of cycles, approximates a sawtooth wave with a sloping leading edge having the same recurrence rate as a complementary sawtooth wave with a sloping trailing edge caused by the intermittent appearance of one or more control pulses and the resulting jumps in the peak value of the condenser charge. Moreover, the length of the measured interval varies directly with the length of an operating cycle of the decadic divider stage and therefore inversely with the oscillator frequency F, a fact which obviates the need for an inverting frequency discriminator as disclosed in the concurrently filed Hoffmann application.

BRIEF DESCRIPTION OF THE DRAWING

The above and other features of our invention will be described in detail hereinafter with reference to the accompanying drawing in which.

SPECIFIC DESCRIPTION

Figure 1:
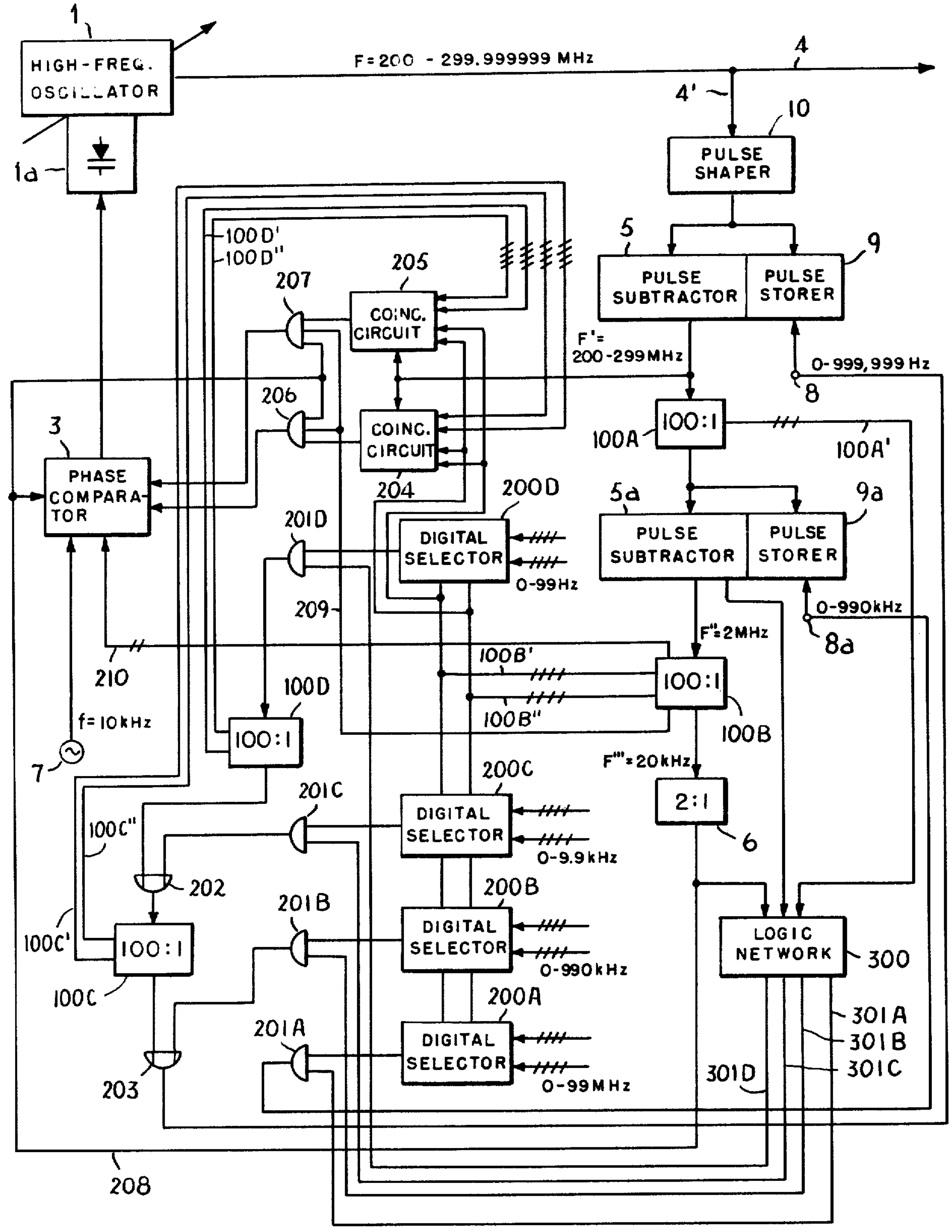
FIG. 1 is an overall block diagram of a frequency synthesizer embodying our invention.

In FIG. 1 we have shown a tunable high-frequency oscillator 1 provided with a tank circuit 1*a*, including a varactor, which determines its operating frequency F. In the specific example here considered, this frequency is assumed to be variable between 200 and 300 (more exactly 299.999,999) MHz.

Oscillator 1 has an output lead 4 from which a branch 4' extends to a pulse shaper 10 which converts the original sinusoidal oscillation thereof into a train of equispaced short pulses referred to hereinafter as spikes. Pulse shaper 10 could also form part of the oscillator itself.

Figures 2, 5:
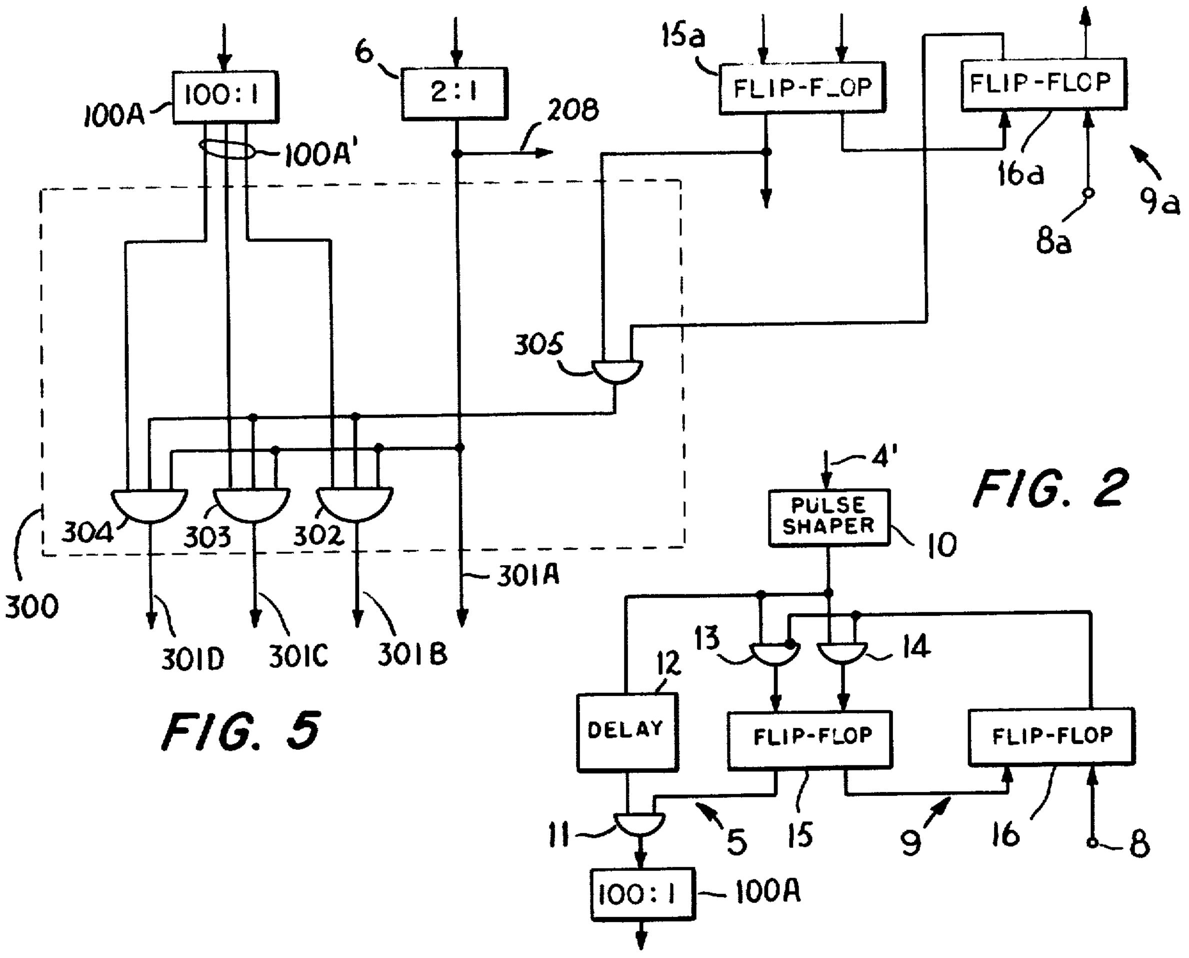
FIG. 2 is a more detailed diagram of a pulse subtractor included in system of FIG. 1.
FIG. 5 is a more detailed diagram of a logic network forming part of the system of FIG. 1.

The spikes emanating from pulse shaper 10 are delivered to a pulse subtractor 5, more fully illustrated in FIG. 2, which is connected through a storage stage 9 to a control terminal 8. Subtractor 5 suppresses one incoming spike for each control pulse appearing on terminal 8, it being assumed that these control pulses may have a mean recurrence rate or cadence $k$ in a range of 0 to 999,999 Hz. Thus, the subtractor delivers a diminished number of spikes whose mean frequency $F' = F - k$ ranges here between 200 and 299 MHz.

The output of pulse subtractor 5 is fed to a frequency divider with two decadic stages 100A, 100B and a terminal binary stage 6 in cascade; each decadic stage has a division factor of 100 : 1 and may be assumed to consist of two cascaded elemental dividers 100 as shown in detail in FIG. 3 described hereinafter. A second pulse subtractor **5*a* with associated pulse storer 9*a*, identical with unit 5, 9, is inserted between divider stages 100A and 100B**.

A generator 7 of constant reference frequency $f$ works into a phase comparator 3 which is also connected to binary stage 6 in order to receive the output of the divider. During steady-state operation, the divider output is a pulse train whose mean frequency is equal to reference frequency $f$, stepped down from oscillator frequency F by the suppression of spikes in subtractor units 5, 9 and **5*a*, 9*a* as well as by the overall divider ratio of 20,000 : 1. With input terminal 8*a* of unit 5*a*, 9*a* receiving control pulses at a rate ranging from 0 to 990 kHz, decadic stage 100B receives a mean frequency $F'' = 2$ MHz and delivers a reduced mean frequency $F''' = 20$ kHz to stage 6** in order to produce a desired final mean frequency of 10 kHz $= f$.

Figure 3:
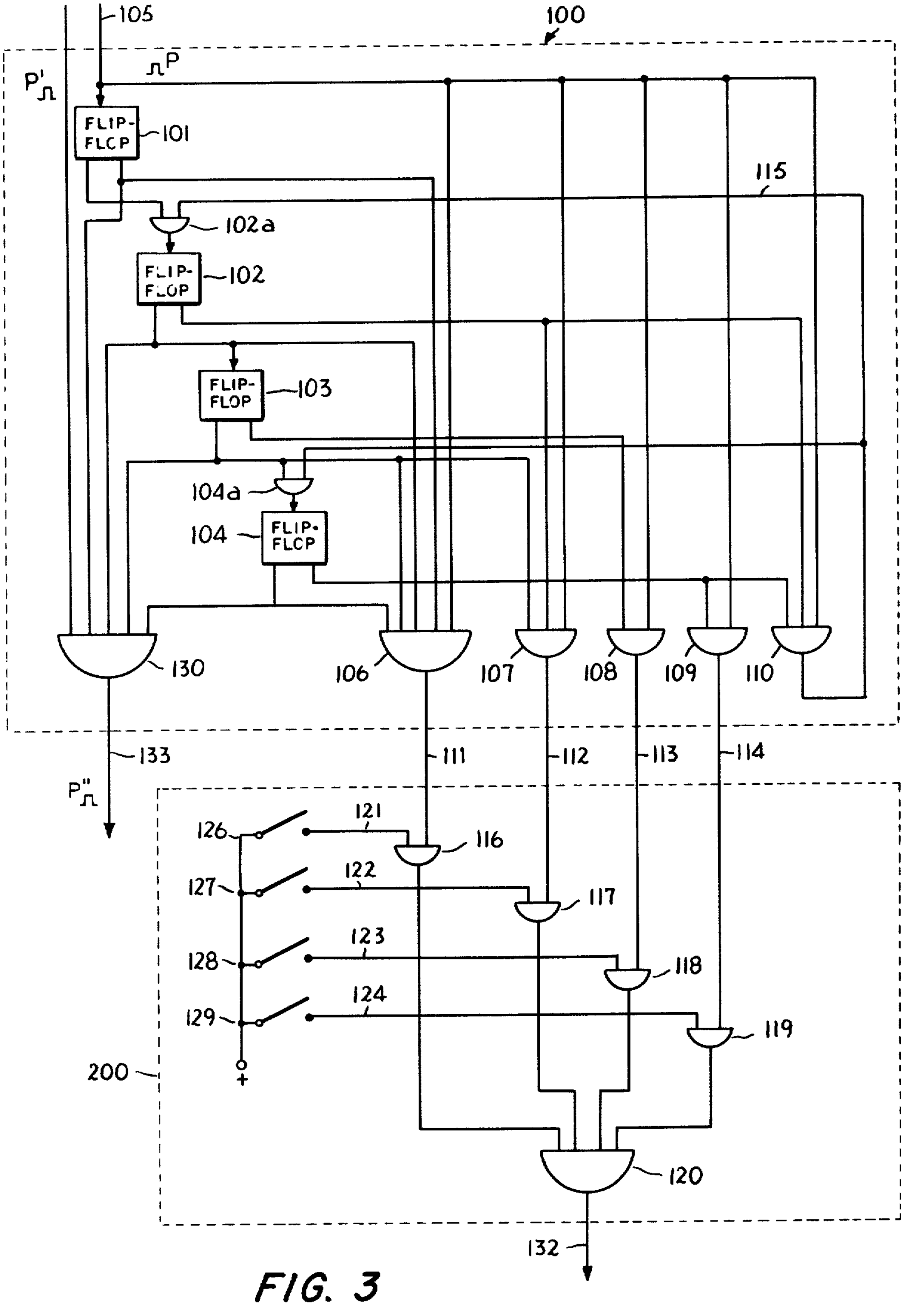
FIG. 3 is a circuit diagram of a decadic divider stage used in the system of FIG. 1.

Divider stage 100B is provided with eight output leads, emanating in groups of four from its two substages (as conventionally indicated by four short oblique strokes crossing each of its two illustrated cables 100B', 100B''), these leads extending in parallel to four digital selectors 200A, 200B, 200C and 200D each having two sets of four manually energizable input leads for selectively extracting a succession of control pulses from any of these output leads (cf. FIG. 3). Selectors 200A – 200D deliver these control pulses through respective AND gates 201A – 201D to subtractor units 5, 9 and **5*a*, 9*a*. AND gate 201A directly works into control terminal 8*a* of unit 5*a*, 9*a*; AND gate 201B energizes the corresponding terminal 8 of unit 5, 9 through an OR gate 203; AND gate 201C delivers its pulses to the same terminal 8 through an OR gate 202, a decadic step-down stage 100C of ratio 100 : 1 and the OR gate 203; and AND gate 201D transmits over the same path with the addition of a further decadic step-down stage 100D of the same ratio 100 : 1. Gates 201A – 201D have other inputs connected to respective conductors 301A, 301B, 301C, 301D originating at a logic network 300 more fully illustrated in FIG. 5; this logic network receives input signals from divider stages 6 and 100A as well as from subtractor 5*a***.

Also connected to leads 100B', 100B'' are two coincidence circuits 204 and 205. Circuit 204 is further connected to similar output leads 100C', 100C'' of step-down stage 100C, circuit 205 being connected in an analogous manner to output leads 100D', 100D'' of step-down stage 100D. The two coincidence circuits 204 and 205 also receive the output of pulse subtractor 5 and work into respective AND gates 206, 207; the latter gates have second inputs connected to the output lead 208 of divider stage 6 and third inputs tied to a lead 209 which emanates from divider stage 100B.

Owing to the presence of the several decadic stages 100A – 100D, selector 200A ranks highest and selector 200D ranks lowest in the numerical weight of the control pulses generated thereby. Thus, selector 200A has an operating range of 0 – 99 MHz; selectors 200B, 200C and 200D have respective ranges of 0 – 990 kHz, 0 - 9.9 kHz and 0 - 99 Hz. Each of these selectors comprises two sets of pushbuttons or the like affording a choice among digits 0 . . . 9 in each of the two decades assigned to it. Thus, the maximum numerical value settable with the combination of these selectors is $10^8-1$ Hz which corresponds to the upper limit of the range of adjustment of oscillator frequency F.

It will therefore be apparent that the unit pulse rate of each selector (i.e., the recurrence rate of its control pulses in selector position 01) is harmonically related to reference frequency $f = 10$ kHz in the case of selectors 200A and 200B but is subharmonically related thereto in the case of selectors 200C and 200D. It is, accordingly, the output of these latter selectors which introduces the fluctuation-causing disturbance in the output of phase comparator 3 whenever their setting differs from 00.

FIG. 2 shows details of the pulse subtractor 5 and of its storage stage 9. The latter comprises a pair of flip-flops 15 and 16, flip-flop 16 having its setting input connected to control terminal 8 and having its set output connected in parallel to an inverting input of an AND gate 13 and to a noninverting input of an AND gate 14; the two AND gates have other (noninverting) inputs connected to lead 4' via pulse shaper 10. This pulse shaper also works, through a delay circuit 12, into one input of a further AND gate 11 whose other input is tied to the reset output of flip-flop 15. The set output of this flip-flop is connected to the resetting input of flip-flop 16; AND gates 13 and 14, when conducting, energize the resetting and setting inputs of flip-flop 15, respectively.

In the absence of a control pulse on terminal 8, flip-flop 16 is reset so that AND gate 13 passes the spikes arriving from pulse shaper 10 and causes the resetting of flip-flop 15 if it had been previously set. In that reset state the flip-flop 15 opens the AND gate 11 to the spikes passing with a slight delay through circuit 12 into divider stage 100A.

The appearance of a control pulse on terminal 8 sets the flip-flop 16 and blocks the AND gate 13 while unblocking the AND gate 14 so that the next spike from pulse shaper 10 also sets the flip-flop 15. This action immediately resets the flip-flop 16; gates 13 and 14 are restored to their normal condition so that the following spike resets the flip-flop 15 in time to give it passage, after its delay in circuit 12, through gate 11.

In FIG. 3 we have illustrated an elemental divider 100 to be used as one of the two identical substages of any stage 100A – 100D. This component comprises four cascaded flip-flops 101, 102, 103 and 104 each with a central switching input whose energization alternately sets and resets the flip-flops as is well known per se. Pulses P, arriving over a lead 105, alternately set and reset the first flip-flop 101 on the trailing edges of these pulses; this has been illustrated in FIG. 4 which also shows that the resetting of any lower-ranking flip-flop 101, 102 or 103 sets the immediately following flip-flop 102, 103 or 104. The pulses P are also fed in parallel to five AND gates 106, 107, 108, 109, 110 having inputs connected in various combinations to the set and reset outputs of the several flip-flops so that gate 106 passes pulse $P_1$ to its output lead 111, gate 107 passes pulses $P_2$ and $P_3$ to its output lead 112, gate 108 passes pulses $P_4$, $P_5$, $P_6$ and $P_7$ to its output lead 113 and gate 109 passes pulses $P_8$ and $P_9$ to its output lead 114. After the passage of pulse $P_9$, flip-flops 102 and 104 are set and open the gate 110 to the passage of the immediately following pulse $P_0$ which, via an output lead 115 and a pair of OR gates **102*a* and 104*a*, resets the flip-flops 102 and 104 at the same time that flip-flop 101** is being set.

Output leads 111, 112, 113, 114 terminate, within a selector 200, at respective AND gates 116, 117, 118 and 119 which in turn work into a common OR gate 120. Four conductors 121, 122, 123, 124 are tied to other inputs of AND gates 116–119 and are selectively energizable by manually operable switch contacts 126, 127, 128 and 129. Selector 200 is, of course, representative of any of the selectors 200A – 200D shown in FIG. 1.

Figure 4:
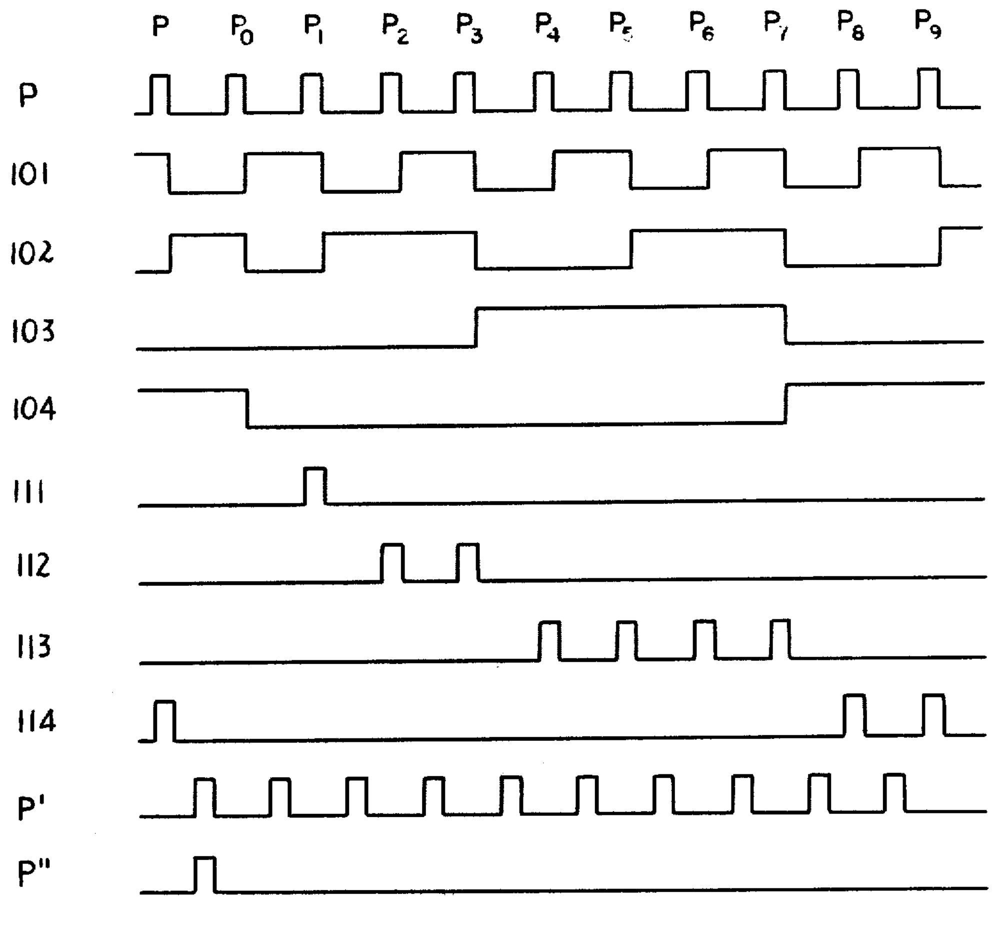
FIG. 4 is a set of graphs relating to the operation of the divider stage of FIG. 3.

The pulses appearing at the end of each cycle on output lead 115 of AND gate 110 could be used to drive the next-following divider stage in a chain of such stages. However, in order to prevent the coincidence of output pulses from the selectors associated with several cascaded divider stages as illustrated in FIGS. 3 and 4, we provide a further AND gate 130 to which pulses P', staggered with reference to driving pulses P, are delivered from a suitable source which in the case of stages 100C and 100D is represented by AND gates 201C and 201D. Gate 130 has inputs connected to the set output of flip-flop 101 and to the reset outputs of flip-flops 102 – 104 so as to conduct only in the interval between pulses $P_0$ and $P_1$.

Depending on the positions of switches 126 – 129, the number of pulses appearing on an output lead 132 of selector100 (energized by OR gate 120) between successive pulses P'' on an output lead 133 of elemental divider 100 (energized by AND gate 130) will range from 0 to 9.

In order to smooth the output voltage of the phase comparator 3 applied to the tank circuit **1*a* of oscillator 1, AND gates 206 and 207 are periodically rendered conductive to cause the buildup of supplemental capacitor charges in phase comparator 3 as discussed above. Binary stage 6 blocks these AND gates in the first part of each operating cycle, during which the output lead 208 is de-energized, while AND gates 201A – 201D are unblocked by the energization of leads 301A – 301D by logic network 300. As illustrated in FIG. 5, this logic network comprises three AND gates 302, 303, 304 each having a first input connected to a respective output lead of divider stage 100A, the three leads being collectively designated 100A' in FIGS. 1 and 5. These AND gates also have second inputs, connected to the output of a further AND gate 305, and third inputs tied to lead 301A which is an extension of the output conductor 208 of divider stage 6. AND gate 305 has its two inputs connected to the reset outputs of flip-flops 15*a* and 16*a* of pulse storer 9*a* so as to be normally conductive; however, gates 302 – 304 will be blocked along with gate 305 in any operating cycle of divider stage 100A in which a spike exiting therefrom is suppressed by a control pulse from terminal 8*a***.

Figure 6:
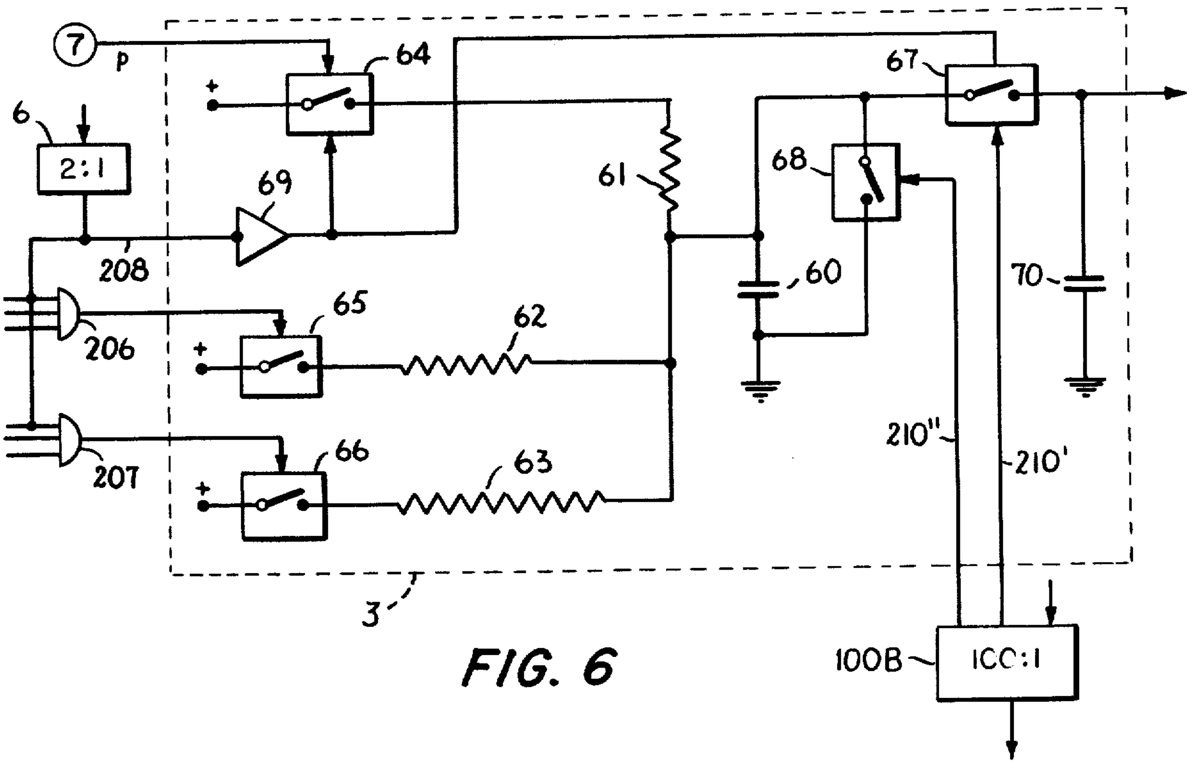
FIG. 6 is a more detailed diagram of a phase comparator included in the system of FIG. 1.

Reference will now be made to FIG. 6 for a more detailed description of phase comparator 3. The comparator comprises three sources of constant current for the charging of a first capacitor 60 forming part of a sawtooth-wave generator, these sources being represented by three resistors 61, 62, 63 connected via switches 64, 65, 66 to positive potential. (It is assumed that the RC networks represented by impendances 60 – 63 have large time constants so that the charging current through the resistor remains virtually constant during the period here considered.) Resistor 61 forms part of a main current source whereas resistors 62 and 63 are part of ancillary current sources supplying the aforementioned additional charges. The magnitude of these currents from the latter sources differ, in accordance with the decadic positions of the associated selectors 200C, 200D and step-down stages 100C, 100D, as symbolized by the different lengths of their resistors. Switches 65 and 66 are connected to the outputs of AND gates 206 and 207 for closure during the time intervals respectively measured by coincidence circuits 204 and 205, namely the fraction of an operating cycle of stage 6 elapsing between the switchover of this stage (i.e. the energization of lead 208) and the detection of a match between the settings of decadic stages 100B and 100C (switch 65) or 100B and 100D (switch 66).

Switch 64 is periodically closed at instants $t_0$ by pulses $p$ (FIG. 7) emitted from generator 7 at the reference rate of recurrence $f$. This closure starts the charging of condenser 60. Through an inverter 69, lead 208 upon its subsequent de-energization reopens the switch 64 at an instant $t_1$ and closes a switch 67 for the transfer of the charge of capacitor 60 to a storage capacitor 70. Divider stage 100B controls the reopening of switch 67 at an instant $t_2$ and the brief closure of a switch 68, enabling the rapid discharge of capacitor 60, via a pair of output leads 210', 210'' collectively represented by a cable 210 in FIG. 1; the discharge period is shown in FIG. 7 as an interval $t_2 - t_3$.

During the first half-cycle of binary stage 6, i.e. within a time of 50 $\mu$s from time $t_1$, gates 201A – 201D are unblocked to permit the generation of control pulses; in the cycle (I) here considered, no control pulses are generated and the oscillator frequency F has its minimum value of 200 MHz. At the midpoint $t_4$ of the cycle, the selectors 200A – 200D are disabled by closure of gates 201A – 201D but gates 206 and 207 open for shorter or longer periods, as explained above, if their associated selectors 200C and 200D have previously loaded the corresponding step-down stages 100C and 100D.

Figure 7:
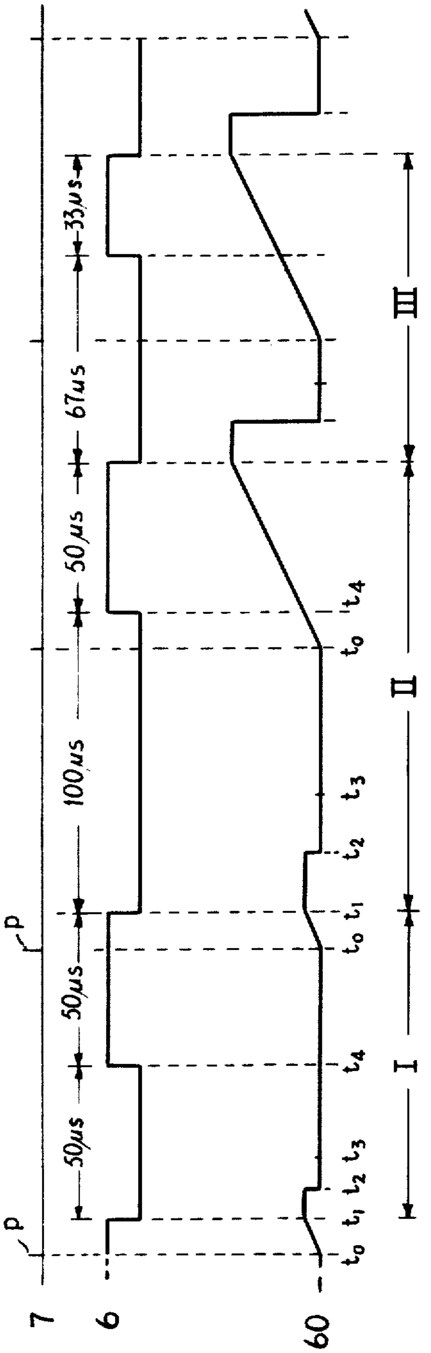
FIG. 7 is a set of graphs relating to the operation of that system.

Cycle II in FIG. 7 represents a transitory state upon a changeover to the upper frequency limit of practically 300 MHz. At this time the operating cycle of stage 6 exceeds that of reference generator 1 by 50 percent so as to last for 150$\mu$s. On the subsequent stabilization at the upper frequency limit of 300 MHz (cycle III), binary stage 6 cuts off for 67$\mu$s and conducts for 33$\mu$s.

Output lead 209 of stage 100B is designed to allow for the transit time in the transmission of pulses to coincidence circuits 204 and 205 by keeping the AND gates 206 and 207 conductive during only a part of the time of energization of conductor 208, e.g. for the last 80 percent (between pulses $P_2$ and $P_0$, FIG. 4) of an operating cycle of divider stage 100A.

We claim:

1. A frequency synthesizer comprising:

oscillator means generating a sequence of spikes of variable repetition frequency F;

a generator of reference frequency $f$ < F;

a frequency divider of step-down ratio $n$:1 having its input connected to receive said sequence of spikes from the output of said oscillator means, said frequency divider including at least one decadic divider stage and a terminal stage;

a pulse subtractor inserted between the output of said oscillator means and the input of said decadic divider stage for suppressing an incoming spike in response to a control pulse applied thereto;

digital selection means connected to said decadic divider stage for deriving therefrom a series of control pulses and applying same to said pulse subtractor to produce a mean frequency lower than F/$n$ in the output of said terminal stage;

phase-comparison means connected to receive said mean frequency from said terminal stage and said reference frequency from said generator, said oscillator means being provided with frequency-control means connected to an output of said phase-comparison means for stabilizing said mean frequency at a value equal to said reference frequency;

compensating circuitry connected to said selection means for delivering to said phase-comparison means a corrective electrical quantity balancing the effect of control pulses with a recurrence rate smaller than f upon the constancy of said repetition frequency during steady-state operation; and blocking means with input connections to said terminal stage and with output connections to said selection means for confining the generation of control pulses to one part and the emission of said corrective quantity to another part of a cycle of said reference frequency.

2. A frequency synthesizer as defined in claim 1 wherein said terminal stage is a binary element, said blocking means including logical circuitry for enabling generation of control pulses and emission of said corrective quantity during alternate half-cycles of said reference frequency.

3. A frequency synthesizer as defined in claim 1 wherein said selection means comprises a plurality of selectors of different ranks, connected in parallel to a set of output leads of said decadic divider stage, and decadic step-down means in the output of at least one relatively low-ranking selector emitting control pulses at a rate subharmonically related to said reference frequency, said compensating circuitry including a coincidence circuit connected to output leads of said decadic divider stage and of said step-down means for comparing their respective counts and emitting a timing signal measuring the length of an interval between a predetermined point in a cycle of said reference frequency and the instant of detection of a match between said counts, said compensating circuitry further including switch means responsive to said timing signal for maintaining the emission of said corrective quantity for the duration of said interval.

4. A frequency synthesizer as defined in claim 3 wherein said phase-comparison means comprises a first capacitor, a main constant-current source for charging said first capacitor, an integrating circuit including a second capacitor, and a set of switches for alternately connecting said first capacitor across said main source and in a discharge path and for transferring a peak charge of said first capacitor to said second capacitor in the course of one cycle of said reference frequency under the control of said generator and said frequency divider whereby a sawtooth wave is developed across said first capacitor with an amplitude depending on the relative phase of said mean frequency and said reference frequency, said compensating circuitry further including at least one ancillary constant-current source for additionally charging one of said capacitors during said interval.

5. A frequency synthesizer as defined in claim 4 wherein said plurality of selectors include several relatively low-ranking selectors emitting control pulses through said step-down means at a rate subharmonically related to said reference frequency, said compensating means including a respective ancillary-current source for each of said low-ranking selectors.

6. A frequency synthesizer as defined in claim 3 wherein said frequency divider includes an additional divider stage upstream of said decadic divider stage, said pulse subtractor comprising a first subtraction unit upstream of said additional divider stage and a second subtraction unit between said decadic and additional divider stages, said plurality of selectors including a relatively high-ranking selector emitting control pulses to said second subtraction unit, said first subtraction unit being connected to said step-down means for receiving the control pulses of said low-ranking selector therefrom.

7. A frequency synthesizer as defined in claim 6, further comprising gating means controlled by said second subtraction unit for stopping the transmission of control pulses to said first subtraction unit during an operating cycle of said additional divider stage in which said second subtraction unit responds to a control pulse applied thereto.

8. A frequency synthesizer as defined in claim 3 wherein said frequency divider includes an additional divider stage upstream of said decadic divider stage, further comprising a set of enabling leads extending from different outputs of said additional divider stage to said selectors for triggering the emission of respective control pulses therefrom in mutually staggered relationship.

9. A frequency synthesizer as defined in claim 3 wherein said frequency divider includes an additional divider stage upstream of said decadic divider stage, further comprising a connection from said additional divider stage to said blocking means for limiting the emission of said corrective quantity to a fraction of each operating cycle of said additional divider stage.

* * * * *